(12) United States Patent
DeVito

(10) Patent No.: US 6,466,096 B1
(45) Date of Patent: Oct. 15, 2002

(54) TUNABLE OSCILLATOR WITH LEAKAGE COMPENSATION

(75) Inventor: Lawrence M. DeVito, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/862,376

(22) Filed: May 22, 2001

(51) Int. Cl.[7] ................................................ H03L 7/087
(52) U.S. Cl. ........................... 331/11; 331/17; 327/156; 327/157
(58) Field of Search ............................. 331/10, 11, 17, 331/18, 25; 327/156–159; 360/51; 375/376; 455/260

(56) References Cited

U.S. PATENT DOCUMENTS 5,027,085 A    6/1991    DeVito ..................... 331/1 A
5,416,691 A    5/1995    Croughwell .............. 363/60
5,767,746 A *  6/1998    Dieterich .................. 331/17

* cited by examiner

*Primary Examiner*—David Mis
(74) *Attorney, Agent, or Firm*—Bromberg & Sunstein LLP

(57) ABSTRACT

A tunable oscillator for producing an output signal includes an input for receiving a first voltage that is a function of the output signal, a controllable oscillator, and a voltage element that produces a second voltage and has a first leak current. The controllable oscillator produces the output signal based upon the first and second voltages, and the first leak current causes the second voltage to fluctuate. The tunable oscillator also includes a current generator operatively coupled with the input. The current generator produces a generator current that is a function of the first voltage, where the first voltage is responsive to fluctuations in the second voltage. The generator current compensates for the fluctuations in the second voltage.

22 Claims, 3 Drawing Sheets

TUNABLE OSCILLATOR WITH LEAKAGE COMPENSATION

FIELD OF THE INVENTION

The invention generally relates to tunable oscillators and, more particularly, the invention relates to compensating for leakage in a voltage element of a tunable oscillator.

BACKGROUND OF THE INVENTION

A phase locked loop ("PLL") is a widely employed feedback circuit for recovering a clock signal from an input data signal. To that end, a PLL typically includes a voltage controlled oscillator ("VCO") for producing an output clock signal that tracks the frequency of the input data signal. Specifically, the output dock signal generally is based upon the difference between the phase of the input data signal and, through a feedback loop, the phase of the output clock signal. The PLL thus locks onto the phase of the input data signal by tracking the output dock signal via a feedback loop. When in the steady state, the output clock signal should have a frequency that is the same as the frequency of the input data signal.

Problems can arise, however, when a PLL first receives an input data signal. In particular, prior to initial receipt of the input data signal, the VCO has no data to generate the output clock signal. Accordingly, many VCOs are configured to generate an arbitrary output clock signal for starting the clock recovery process. As known by those skilled in the art, problems often arise if the arbitrary output clock signal has a frequency that is much different from that of the input data signal. Consequently, data from the input data signal can be lost.

One way the art has responded to this problem by using voltage controlled crystal oscillators ("VCXOs") instead of conventional VCOs. More particularly, VCXOs have certain material properties that enable them to generate the arbitrary output clock signal within a rated frequency range expected of the input data signal. Use of VCXOs, however, also presents a number of problems. For example, VCXOs typically are much more expensive and use more area on a circuit board than conventional VCOs. In addition, VCXOs also have a relatively limited frequency range, and often demonstrate poor jitter tolerance.

SUMMARY OF THE INVENTION

In accordance with one aspect of the invention, a tunable oscillator for producing an output signal includes an input for receiving a first voltage that is a function of the output signal, a controllable oscillator, and a voltage element that produces a second voltage and has a first leak current. The controllable oscillator produces the output signal based upon the first and second voltages, and the first leak current causes the second voltage to fluctuate. The tunable oscillator also includes a current generator operatively coupled with the input. The current generator produces a generator current that is a function of the first voltage, where the first voltage is responsive to fluctuations in the second voltage. The generator current compensates for the fluctuations in the second voltage.

In some embodiments, the generator current and a set of other currents are directed toward the voltage element. In such case, the tunable oscillator may include a node that adds the generator current and the set of other currents. The sum of all currents combined by the current combining element preferably equals, but has an opposite polarity to, the first leak current.

The first leak current may fluctuate between a zero value and a nonzero value. The tunable oscillator also may include a voltage combining element that processes the first voltage and the second voltage, and directs the processed voltages toward the controllable oscillator.

In some embodiments, the tunable oscillator also has a frequency detector for producing a comparison signal based on the comparison of the output signal and a reference signal having a reference frequency. The comparison signal is directed toward the voltage element. The output signal has an output frequency, and the comparison signal has a first maximum amplitude when the difference between the output frequency and the reference frequency exceeds a preset amount. The comparison signal has a second maximum amplitude when the difference between the output frequency and the reference frequency does not exceed the preset amount. The first maximum amplitude is greater than the second maximum amplitude.

Another aspect of the invention includes a system for compensating for potential fluctuations in a voltage element of a tunable oscillator. The voltage element produces a first tuning voltage that fluctuates in response to the fluctuations, while the tunable oscillator produces an output signal with an output characteristic that is a function of the first tuning voltage. The system includes a current generator that produces a generator current based upon a second tuning voltage, and a current delivery node that directs the generator current toward the voltage element. The second tuning voltage is a function of the output characteristic, while the first tuning voltage is a function of the generator current to dynamically offset the fluctuations.

In some embodiments, a set of other currents are directed toward the voltage element. The current delivery node preferably includes a current combining element that combines the generator current with the set of other currents. In other embodiments, the output characteristic may be at least one of an output frequency and an output phase.

In some embodiments, the voltage element includes a capacitor that stores a voltage, and the compensation current controls the voltage of the capacitor in response to the fluctuations. The fluctuations may be caused by a leakage current of the voltage element, and the current generator may include a transconductance amplifier.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a phase locked loop in a clock recovery circuit uses a frequency loop to ensure that the initial output signal of its local voltage controlled oscillator is within a frequency range that is rated to an expected input frequency. In addition, the frequency loop preferably is configured to compensate for unintended voltage and current fluctuations produced by components in the frequency loop. Details of various embodiments of the invention are discussed below with reference to FIGS. 1–3.

Figure 1:
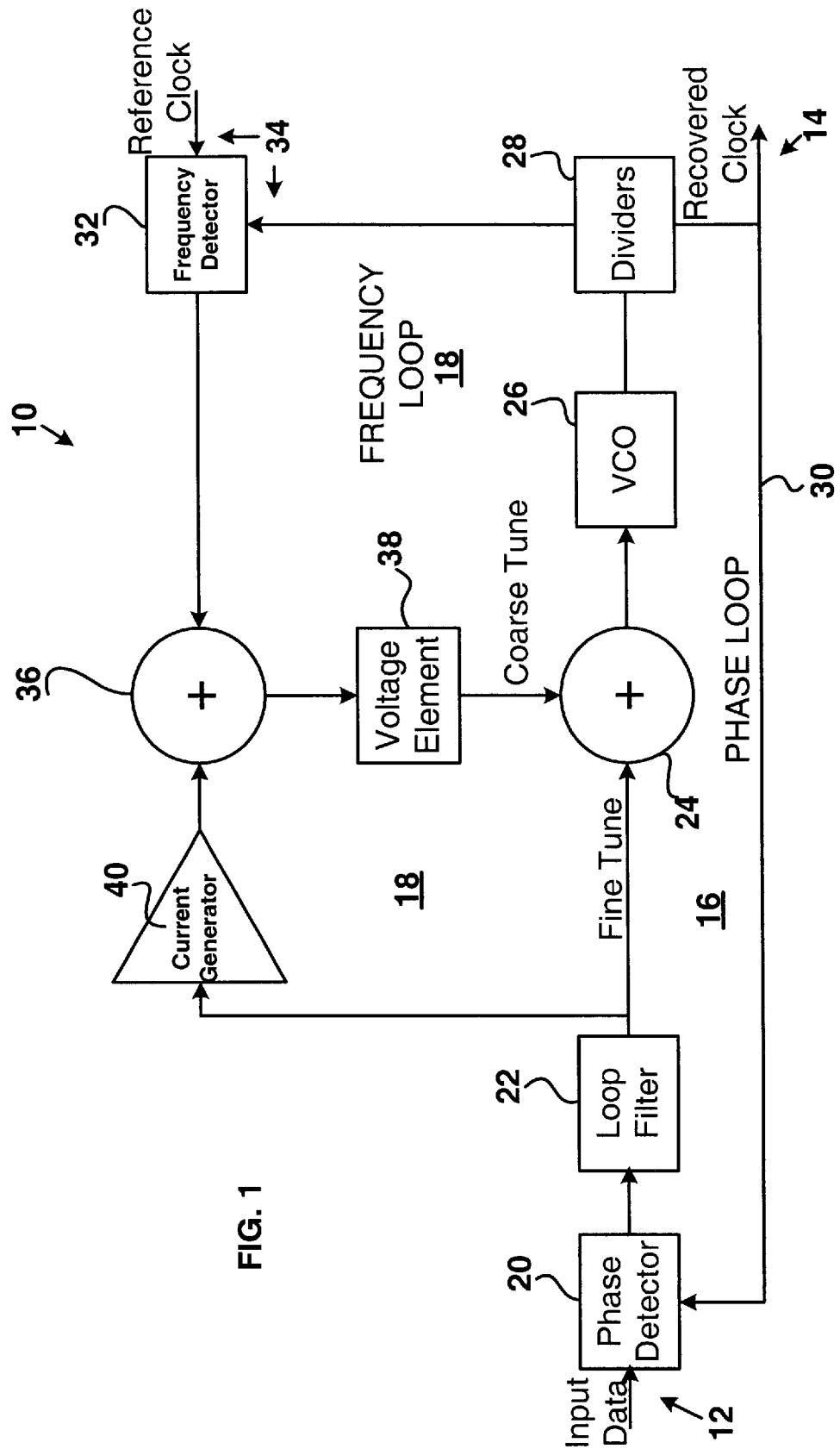
FIG. 1 schematically shows a clock recovery circuit configured in accordance with illustrative embodiments of the invention.

FIG. 1 schematically shows a clock recovery circuit 10 configured in accordance with illustrative embodiments of the invention. Among other things, the clock recovery circuit 10 may be implemented as an integrated circuit chip, or on a circuit board. The clock recovery circuit 10 includes a data input 12 for receiving an input data signal, and an output 14 for delivering a recovered output clock signal ("output clock signal") from the input data signal. As known by those skilled in the art, the input data signal transmits data in a carrier signal having an associated frequency represented by the clock signal.

As noted above, the dock recovery circuit 10 includes a phase locked loop ("PLL 16") that uses a frequency loop 18 as a tunable oscillator. In particular, the PLL 16 includes a phase detector 20 for generating a first control signal based upon the comparison of the input data signal and the (feedback) output clock signal, a loop filter 22 for filtering the comparison signal, and a voltage processing element 24 for processing a first DC control voltage received from the loop filter 22 and a second DC control voltage applied by the frequency loop 18. As discussed below, the first DC control voltage is referred to as a "fine tune voltage," while the second DC control voltage is referred to as a "coarse tune voltage."

In illustrative embodiments of the invention, the phase detector 20 is similar to the phase detector disclosed in U.S. Pat. No. 5,027,085. In a similar manner, the loop filter 22 is similar to that disclosed in U.S. Pat. No. 5,416,691. The disclosures of both of these patents are incorporated herein, in their entireties, by reference.

Also as shown in the figure, the PLL 16 includes a controllable oscillator, such as a voltage controlled oscillator ("VCO 26"), for producing the output clock signal based on the processed fine tune and coarse tune voltages, a set of frequency dividers 28 for dividing the output clock signal between the frequency loop 18 and other parts of the circuit 10, and a feedback loop 30 for directing a copy of the output clock signal back to the phase detector 20. In addition to being directed back to the phase detector 20 and to the frequency loop 18, the output clock signal also is directed to the output 14 for use by some external circuit (e.g., a circuit that reads data from the data signal). In some embodiments, the set of dividers 28 includes divide-by-one frequency dividers for directing the output clock signal to the phase detector 20 and to the output 14. The set of dividers 28 can include integer and non-integer divide by frequency dividers, and others specifically for use with components in the frequency loop 18 (described below).

In illustrative embodiments, the controllable oscillator 26 (exemplified herein as a VCO 26) produces an output clock signal having a frequency based upon some signal received at its input. Although such input signals shown are DC voltage signals, those skilled in the art should appreciate that the input signals may be any type known in the art that can be distinguished to produce such output. For example, the input signals may be DC currents, AC currents, or AC voltage signals. As another example, a data control signal may be used as an input signal. Upon receipt, the controllable oscillator may access a look-up table to determine an appropriate output frequency.

When in use, the phase detector 20 compares the input data signal with the output dock signal, and generates a plurality of output signals. Among those signals is a very low frequency voltage (essentially a DC voltage) that generally represents the degree of difference between the phase of the input data signal and the output clock signal. This DC voltage (noted above and referred to as the "control voltage" and the "fine tune voltage") passes through the loop filter 22, which filters out other signals produced by the phase detector 20. Those other signals typically include the original frequencies, their harmonics, and the sum frequency.

The voltage processing element then processes the fine tune voltage and the above noted coarse tuning voltage, and then forwards such processed voltages to the VCO 26. In some embodiments, the voltage processing element is a voltage adding device that effectively adds the two voltages. In other embodiments, the voltage processing element is eliminated, and the VCO 26 includes a pair of inputs (shown schematically as a single input) that each directly receives one of the coarse and fine tune voltages. Each input may be coupled with a respective voltage variable capacitor that processes the respective received voltage to control the output produced by the VCO 26. In still other embodiments, the voltage processing element 24 can convert the noted voltages into currents that are used as an input to the VCO 26, or otherwise process the voltages in any manner deemed useful.

The VCO 26 responsively generates the output clock signal having a frequency based upon the two processed voltages. In the steady state, the output clock signal has a frequency that is identical to the frequency of the input data signal. Those skilled in the art should appreciate that the frequency of the output dock signal should track the frequency of the input data signal as it drifts, if at all, from its intended center frequency. Of course, if the frequency of the input data signal does not change, then the frequency of the output clock signal also should not significantly change. Just after the frequency of the input data signal changes, however, there may be some time period when such frequency is not insignificantly different than that of the output clock signal. The PLL 16 responsively modifies the frequency of the output dock signal to match such changed input frequency.

As suggested above, the coarse tune voltage is generated by the frequency loop 18 to ensure that the VCO 26 operates within a specified frequency range. For example, the input data signal typically is expected to operate at a rated center frequency. In such case, the coarse tune voltage provides a DC voltage for biasing the VCO 26 to generate an output clock signal that is at least close to the rated center frequency. The fine tune voltage thus is generated to cause the VCO 26 to finely deliver the output clock signal with a frequency that is identical to the frequency of the input data signal. In other words, the coarse tuning voltage brings the output clock signal to a desired frequency range, which is fine tuned by the fine tune voltage. This desired frequency range illustratively is fully controllable by the fine tune voltage.

The frequency loop 18 also is configured to provide the coarse tune voltage to the VCO 26 upon initial receipt of a data input signal. Accordingly, at that time, the frequency of the initial output dock signal should close enough to that of the input data signal to ensure that acquisition may be achieved. To these ends, the frequency loop 18 includes a frequency detector 32 having a pair of inputs 34 for receiving both a reference signal and the output clock signal. In illustrative embodiments, the set of dividers 28 includes one frequency divider that reduces the output clock frequency to a much lower proportional frequency. In such case, the reference clock signal, which is generated by a fixed oscillator (not shown), is selected to have a frequency that is proportionally lower than the frequency expected of the input data signal.

Figure 2:
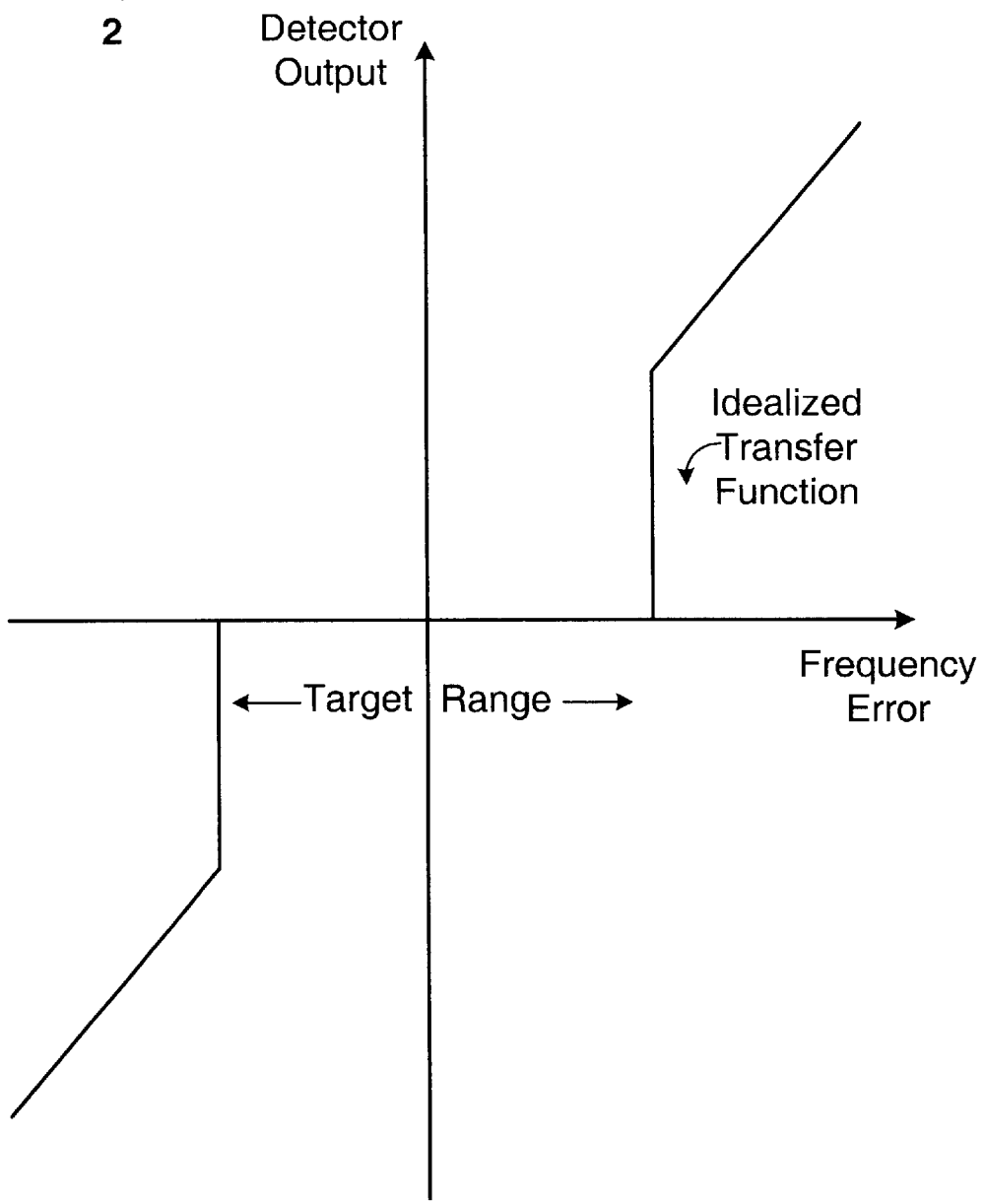
FIG. 2 graphically shows a filter that is used by the frequency detector shown in FIG. 1.

The frequency detector 32 compares the frequency of the reference signal with that of the output clock signal to determine the difference between the two frequencies. Accordingly, the frequency detector 32 can operate at a relatively low rate (when compared to the input data signal frequency) since the two compared frequencies are reduced in the manner noted above. In illustrative embodiments, the frequency detector 32 implements a filter having a transfer function as shown in FIG. 2. As qualitatively shown by the disclosed transfer function, if the frequency difference is within a prespecified target frequency range ("target range"), the frequency detector 32 delivers no output signal toward the upstream circuit elements (discussed below). If the frequency difference is outside of the target range, however, then a difference signal is delivered to the upstream circuit elements. In illustrative embodiments, this difference signal is a DC current.

The transfer function shown in FIG. 2 illustratively is a non-zero linear function when outside the target range, and a zero function when inside the target range. In some implementations, a function producing a non-zero amplitude may exist within the target range, and some other non-zero function may be used in the region outside the target range. In many embodiments, however, the absolute value of the amplitude of the function in the target range does not exceed the absolute value of the amplitude of the function outside of the target range.

Furthermore, in yet other embodiments, the width of the target range can be a variable amount depending upon whether the frequency difference (detected by the frequency detector 32) is within or not within the target range. For example, the target range can have a width of about 500 parts per million when the frequency difference is outside the target range. Conversely, the target range can have a width of about 1000 parts per million when the frequency difference is inside the target range. This changing width should provide improved circuit performance.

The frequency loop 18 thus also includes a current processing element 36 for processing currents (e.g., the difference signal from the frequency detector 32), a voltage element 38 for producing the coarse tune voltage based upon the currents received from the current processing element 36, and a current generator 40 for compensating for leakage currents within the voltage element 38. Each of these elements now will be discussed in greater detail.

The voltage element 38, which may be implemented as a loop filter, includes a capacitance that is charged by the currents received from the current processing element 36. The voltage produced by this capacitance is the coarse tune voltage. In illustrative embodiments, the voltage element 38 is implemented as a charge pump that maintains the desired state in the form of a capacitor charge even when the frequency detector 32 is "off" (i.e., within the target zone). Undesirably, the charge pump may have an associated leakage current that causes the capacitor voltage to decrease. It thus follows that if the capacitor voltage decreases, the coarse tune voltage decreases (i.e., fluctuates) in a corresponding manner.

To compensate for this voltage decrease caused by the voltage element 38, the current generator 40 is configured to generate a current based upon the fine tune voltage received at its input. This generated current is directed to the current processing element 36, which directs this, and other currents (if any) to the capacitance within the voltage element 38, thus maintaining the coarse tune voltage at desired levels. In illustrative embodiments, the current processing element 36 merely is a node that effectively adds DC currents for delivery to the voltage element 38. Details of the operation of this compensation function are discussed below.

Figure 3:
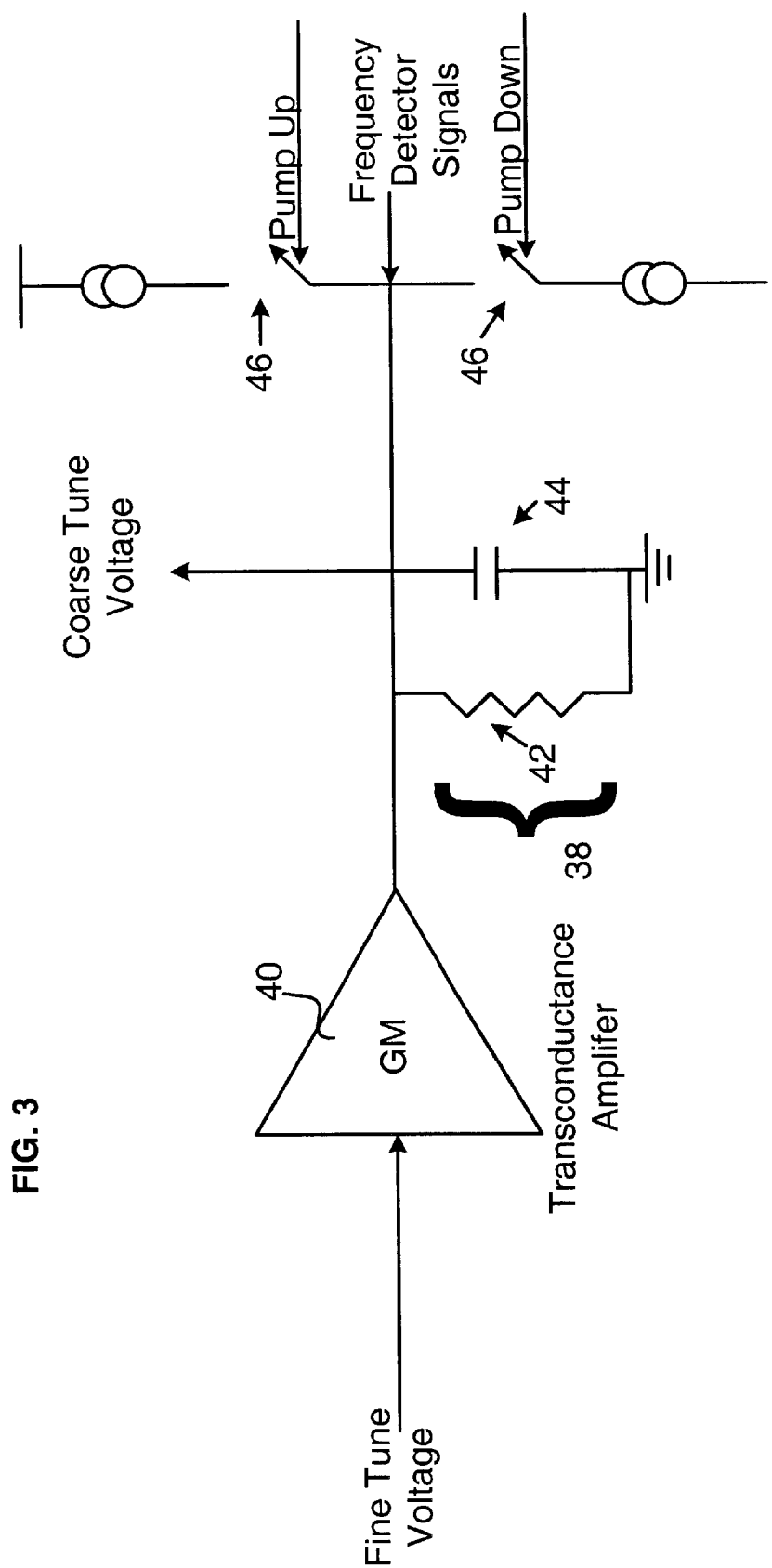
FIG. 3 schematically shows one embodiment of the leakage cancellation circuit shown in FIG. 1.

FIG. 3 schematically shows a simplified implementation of the frequency loop 18 in accordance with illustrative embodiments of the invention. The voltage element 38, which may be a loop filter, includes a resistor 42 in parallel with a capacitor 44, while the current generator 40 may be a transconductance amplifier. A pair of switches 46 alternatively also are included to deliver current to, or remove current from, the capacitor 44 as specified by the frequency detector 32.

In illustrative embodiments, the switches 46 are both open when the frequency difference detected by the frequency detector 32 is within the target range. When not in the frequency range, the switches 46 are turned on and off at a prescribed duty cycle that depends upon the magnitude of the detected frequency difference (i.e., as specified by the transfer function in FIG. 2). The prescribed duty cycle increases linearly as the magnitude of the difference signal increases. For example, the duty cycle of the switch labeled "pump up" is relatively large when the reference signal frequency is much larger than that of output clock signal. This causes a larger current to be directed toward the voltage element 38, consequently increasing the coarse tune voltage and thus, the output clock signal frequency. Accordingly, as the output clock signal frequency increases toward the reference signal frequency, the duty cycle of the pump up switch decreases. The switch labeled as the "pump down" switch operates in a similar manner, but with opposite polarities.

It should be noted that various types of components described in the clock recovery circuit 10 are exemplary. Other types of components thus may be used to accomplish the same function. For example, instead of using an oscillator as a clock for the reference signal, a timing signal from some other circuit element may be used. Accordingly, various embodiments should not be limited to such specific types of components.

The general operation of various aspects of the frequency loop 18 as it operates within the overall clock recovery circuit 10 now will be discussed. When an input data signal is initially received at the input 12, the coarse tune voltage preferably already has been initialized to be at a prespecified voltage. This initialized voltage ensures that the initial output clock signal is tunable with the fine tune voltage.

Specifically, when the circuit 10 is initially energized (i.e., no signal is received at the input 12), there may be some nominal output dock signal generated by the VCO 26. If the frequency detector 32 determines that there is a large difference between the frequencies of the reference signal and the output clock signal, then it will begin positively or negatively charging the capacitor 44 in the voltage element 38. This forces the coarse tune voltage to a voltage level that causes the VCO 26 to deliver the output clock signal at the rated frequency range. Accordingly, when in this state, the circuit 10 is able to receive the input data signal for clock recovery purposes.

After the circuit 10 is initialized as discussed above, then it may recover the clock signal from the input data signal. In addition, fluctuations in the coarse tune voltage are compensated for by the current generator 40. For example, as the leakage current dissipates across the resistor 42, the coarse tune voltage drops. This drop causes the VCO 26 to deliver an output clock signal with a phase that lags the phase of the input data signal. The phase detector 20 and loop filter 22 of the PLL 16 detect this lag, and thus increase the fine tune voltage. This increase in the fine tune voltage causes the current generator 40 to produce an increased generator current. This increased generator current is directed into the voltage element 38, thus charging the capacitor 44. The coarse tune voltage consequently increases as the capacitor 44 charges, thereby causing the VCO 26 to correspondingly cause the output clock signal to gain phase relative toward the input data signal phase. This increase in phase is detected by the PLL 16, which causes the fine tune voltage to decrease in a corresponding manner. This process iterates until the phase of the output clock signal substantially matches that of the input data signal.

A set of other currents also may be directed to the voltage element 38. For example, even when the frequency detector 32 is in its target zone (see FIG. 2), it still may have some leakage current of its own that also (at least in part) causes the charge of the voltage element to fluctuate. This current thus coupled with the current delivered by the generator current preferably cancels out the leakage current from the voltage element 38, thus maintaining the coarse tune voltage at a substantially constant voltage. There may be instances when this leakage current actually charges the voltage element 38 faster than the voltage element 38 discharges its leakage current. In such case, the current generator 40 responds by providing a generator current that compensates for such current. In illustrative embodiments, the current generator 40 compensates for this, and other potential leakage currents, within the overall circuit 10.

Accordingly, various disclosed embodiments provide a frequency loop 18 that both delivers the appropriate initialization signals, and compensates for leakage current from the voltage element 38. It is anticipated that if an implementation of the invention had no leakage current from the voltage element 38, illustrative embodiments still should provide appropriate compensation for other leakage currents that affect the capacitor 44 within the voltage element 38. In particular, the current generating element still should provide the appropriate positive or negative currents to offset such effects.

In addition to leakage currents, other factors may impact the output of the VCO 26. One such factor is referred to herein as "aging." Specifically, aging refers to the fact that component values often change with time. Another such factor is the temperature of the circuit 10. More particularly, the output clock signal produced by the VCO 26 undesirably can change with changing temperature. In such event, even if there is no fluctuation to the voltage(s) applied to the input of the VCO 26, the frequency loop 18 still compensates for such changed output clock signal to ensure that it continues to track the input data signal. In fact, the frequency loop 18 preferably simultaneously compensates for both fluctuations current received by the VCO 26 (described above) and temperature variations.

It should be noted that although specified voltage elements and current elements were disclosed, those skilled in the art can implement various embodiments using different types of devices. For example, instead of having tuning voltages, tuning currents can be used to tune a controllable oscillator that is sensitive to input currents. Accordingly, discussion of such devices is exemplary only and not intended to limit various embodiments of the invention.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

I claim:

1. A tunable oscillator for producing an output signal, the tunable oscillator comprising:
   an input for receiving a first voltage, the first voltage being a function the output signal;
   a controllable oscillator;
   a voltage element that produces a second voltage and has a first leak current, the controllable oscillator producing the output signal based upon the first and second voltages, the first leak current causing the second voltage to fluctuate; and
   a current generator operatively coupled with the input, the current generator producing a generator current that is a function of the first voltage, the first voltage being responsive to fluctuations in the second voltage, the generator current compensating for the fluctuations in the second voltage.

2. The tunable oscillator as defined by claim 1 wherein the generator current and a set of other currents are directed toward the voltage element.

3. The tunable oscillator as defined by claim 2 further comprising a node that adds the generator current and the set of other currents.

4. The tunable oscillator as defined by claim 3 wherein the sum of all currents combined by the current combining element equals, but has an opposite polarity to, the first leak current.

5. The tunable oscillator as defined by claim 1 wherein the first leak current fluctuates between a zero value and a nonzero value.

6. The tunable oscillator as defined by claim 1 further comprising a voltage combining element that processes the first voltage and the second voltage, and directs the processed voltages toward the controllable oscillator.

7. The tunable oscillator as defined by claim 1 further comprising:
   a frequency detector for producing a comparison signal based on the comparison of the output signal and a reference signal having a reference frequency, the comparison signal being directed toward the voltage element.

8. The tunable oscillator as defined by claim 7 wherein the output signal has an output frequency, the comparison signal having a first maximum amplitude when the difference between the output frequency and the reference frequency exceeds a preset amount, the comparison signal having a second maximum amplitude when the difference between the output frequency and the reference frequency does not exceed the preset amount, the first maximum amplitude being greater than the second maximum amplitude.

9. The tunable oscillator as defined by claim 7 wherein the frequency detector has a second leak current, the second leak current being directed toward the voltage element.

10. A system for compensating for potential fluctuations in a voltage element of a tunable oscillator, the voltage element producing a first tuning voltage that fluctuates in response to the fluctuations, the tunable oscillator producing an output signal with an output characteristic that is a function of the first tuning voltage, the system comprising:
    a current generator that produces a generator current based upon a second tuning voltage, the second tuning voltage being a function of the output characteristic; and a current delivery node that directs the generator current toward the voltage element, the first tuning voltage being a function of the generator current to dynamically offset the fluctuations.

11. The system as defined by claim 10 wherein a set of other currents are directed toward the voltage element.

12. The system as defined by claim 11 wherein the current delivery node includes a current combining element that combines the generator current with the set of other currents.

13. The system as defined by claim 10 wherein the output characteristic is at least one of an output frequency and an output phase.

14. The system as defined by claim 10 wherein the voltage element includes a capacitor that stores a voltage, the compensation current controlling the voltage of the capacitor in response to the fluctuations.

15. The system as defined by claim 10 wherein the fluctuations are caused by a leakage current of the voltage element.

16. The system as defined by claim 10 wherein the current generator includes a transconductance amplifier.

17. A system for compensating for fluctuations of an output clock signal delivered by a controllable oscillator, the fluctuations causing an output characteristic of the output clock signal to fluctuate, the controllable oscillator being a part of a tunable oscillator having a voltage element, the fluctuations at least being caused by one or more of a fluctuating voltage in the voltage element, aging, and temperature changes in the tunable oscillator, the system comprising:

a current generator that produces a generator current based upon a first tuning voltage, the first tuning voltage being a function of the output characteristic; and a current delivery node that directs the generator current toward the voltage element to produce a second tuning voltage, the second tuning voltage being a function of the generator current to dynamically offset the fluctuations.

18. The system as defined by claim 17 wherein the current delivery node directs a set of other currents toward the voltage element.

19. The system as defined by claim 18 wherein the current delivery node includes a current combining element that combines the generator current with the set of other currents.

20. The system as defined by claim 17 wherein the output characteristic is at least one of an output frequency and an output phase.

21. The system as defined by claim 17 wherein the current generator includes a transconductance amplifier.

22. A system for compensating for potential fluctuations in a voltage element of a tunable oscillator, the voltage element producing a first tuning voltage that fluctuates in response to the fluctuations, the tunable oscillator producing an output signal with an output characteristic that is a function of the first tuning voltage, the system comprising:

means for producing a generator current based upon a second tuning voltage, the second tuning voltage being a function of the output characteristic; and means for directing the generator current toward the voltage element, the first tuning voltage being a function of the generator current to dynamically offset the fluctuations.

* * * * *